(12) United States Patent
Park et al.

(10) Patent No.: US 10,971,552 B2
(45) Date of Patent: Apr. 6, 2021

(54) DISPLAY DEVICE

(71) Applicant: Samsung Display Co., Ltd., Yongin-si (KR)

(72) Inventors: Taejin Park, Seoul (KR); Soonnyung Park, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/406,909

(22) Filed: May 8, 2019

(65) Prior Publication Data

US 2020/0035759 A1    Jan. 30, 2020

(30) Foreign Application Priority Data

Jul. 24, 2018  (KR) .......................... 10-2018-0086208

(51) Int. Cl.
| | | |
|---|---|---|
| *H01L 27/32* | (2006.01) | |
| *G06F 3/01* | (2006.01) | |
| *G06F 3/047* | (2006.01) | |
| *H01L 27/12* | (2006.01) | |

(52) U.S. Cl.
CPC .......... *H01L 27/3209* (2013.01); *G06F 3/016* (2013.01); *G06F 3/047* (2013.01); *H01L 27/1214* (2013.01)

(58) Field of Classification Search
None
See application file for complete search history.

(56) References Cited

U.S. PATENT DOCUMENTS

| | | | |
|---|---|---|---|
| 9,755,184 B2 | 9/2017 | Park et al. | |
| 10,114,422 B2 | 10/2018 | Lee et al. | |
| 10,496,134 B2 * | 12/2019 | Park | H04M 1/0266 |
| 2018/0088631 A1 | 3/2018 | Park et al. | |
| 2018/0091635 A1 | 3/2018 | Lee et al. | |
| 2018/0098442 A1 | 4/2018 | Han | |

FOREIGN PATENT DOCUMENTS

| | | |
|---|---|---|
| KR | 10-1182228 B1 | 9/2012 |
| KR | 10-2013-0101717 A | 9/2013 |
| KR | 10-2016-0119395 A | 10/2016 |
| KR | 10-2018-0029172 A | 3/2018 |
| KR | 10-2018-0034781 A | 4/2018 |
| KR | 10-2018-0037646 A | 4/2018 |

* cited by examiner

*Primary Examiner* — Robert K Carpenter
(74) *Attorney, Agent, or Firm* — Lewis Roca Rothgerber Christie LLP

(57) ABSTRACT

A display device may include a display module and a cushion layer. The display module may include a display panel, which includes a circuit layer, a light emitting device layer on the circuit layer, and an encapsulation layer encapsulating the light emitting device layer, and a window substrate, which is on the display panel. A pattern including a vibration attenuating line extending in a direction may be defined by the cushion layer, and the cushion layer may be below the display module. The vibration attenuating line may be spaced apart from an edge of the cushion layer by a first length, and the first length may be a value obtained by dividing a sound speed in the display module by a natural frequency of the display module.

17 Claims, 12 Drawing Sheets

DISPLAY DEVICE

CROSS-REFERENCE TO RELATED APPLICATION

This application claims priority to and the benefit of Korean Patent Application No. 10-2018-0086208, filed on Jul. 24, 2018 in the Korean Intellectual Property Office (KIPO), the entire content of which is incorporated herein by reference.

BACKGROUND

Various display devices are being developed for use in multimedia devices, such as televisions, mobile phones, tablet computers, navigation systems, and gaming machines.

In the case where a display device falls and hits another surface, the display device may be cracked by a collision or impact. A display device may include a cushion layer to absorb the impact.

However, even if the cushion layer is provided in the display device, the impact may be concentrated on a specific portion of the display device due to resonance caused by a standing wave, and this may lead to the display device being broken or damaged.

SUMMARY

An aspect of some example embodiments of the inventive concept are directed toward a display device, which is configured to reduce vibration of a display module caused by collision of the display device and to prevent or suppress a crack from being formed in the display module. In particular, since the display device includes a cushion layer in which a pattern is defined in consideration of a wavelength of a standing wave in the display module, it may be possible to reduce a collision-induced impact on the display module and to prevent or suppress a crack from being formed in the display module of the display device.

According to an embodiment of the inventive concept, a display device may include a display module and a cushion layer.

In an embodiment, the display module may include a display panel, an input-sensing circuit on the display panel, and a window substrate on the input-sensing circuit. The display panel may include a circuit layer including a plurality of transistors, a light emitting device layer, which is on the circuit layer and includes a plurality of light-emitting devices, and an encapsulation layer encapsulating the light emitting device layer.

In an embodiment, the cushion layer may be below the display module, and a pattern including a vibration attenuating line extending in a direction may be defined by the cushion layer. The vibration attenuating line may be spaced apart from an edge of the cushion layer by a first length, and the first length may be a value obtained by dividing a sound speed in the display module by a natural frequency of the display module.

In an embodiment, the display device may further include a supporting member below the cushion layer.

In an embodiment, the vibration attenuating line may be an opening defined in the cushion layer.

In an embodiment, the display device may further include a blocking member, which is between the display module and the cushion layer and has a black color. The blocking member may include a blocking base portion and a blocking protrusion portion protruding from the blocking base portion into the opening.

In an embodiment, the cushion layer may include a base cushion portion and a protruding portion protruding from the base cushion portion. The vibration attenuating line may be the protruding portion, and the base cushion portion and the protruding portion may constitute a single integral object.

In an embodiment, the pattern may further include an auxiliary vibration attenuating line parallel to the vibration attenuating line and spaced apart from the edge of the cushion layer by a second length that is half the first length.

In an embodiment, the edge may be one of vertices of the cushion layer, and the vibration attenuating line may be inclined at an acute angle to a side edge of the cushion layer.

In an embodiment, the pattern may further include a first auxiliary vibration attenuating line, a second auxiliary vibration attenuating line, and a third auxiliary vibration attenuating line. The first auxiliary vibration attenuating line may be parallel to the vibration attenuating line and may be spaced apart from the edge of the cushion layer by a second length that is half the first length. The second auxiliary vibration attenuating line may be between the vibration attenuating line and the first auxiliary vibration attenuating line. The third auxiliary vibration attenuating line may be between the first auxiliary vibration attenuating line and the edge.

In an embodiment, each of the second auxiliary vibration attenuating line and the third auxiliary vibration attenuating line may be spaced apart from the first auxiliary vibration attenuating line by a third length that is half the second length.

In an embodiment, the pattern may include a fourth auxiliary vibration attenuating line, which crosses at least one selected from the vibration attenuating line, the first auxiliary vibration attenuating line, the second auxiliary vibration attenuating line, and the third auxiliary vibration attenuating line, and a fifth auxiliary vibration attenuating line, which is parallel to the fourth auxiliary vibration attenuating line. At least one selected from the fourth auxiliary vibration attenuating line and the fifth auxiliary vibration attenuating line may be spaced apart from another edge of the cushion layer by a fourth length that is equal to one selected from the first length, the second length, and the third length.

In an embodiment, the cushion layer may include a first layer, a second layer on the first layer, and a third layer on the second layer. The pattern may be defined in the second layer.

According to an embodiment of the inventive concept, a display device may include a display module, a first cushion layer, and an adhesive member.

In an embodiment, the display module may include a display panel, an input-sensing circuit, and a window substrate.

In an embodiment, a first cushion layer may be below the display module, and a first pattern including a first vibration attenuating line may be defined by the first cushion layer. The adhesive member may be between the display module and the first cushion layer and may have a black color. A portion of the display module overlapped with the first vibration attenuating line may be spaced apart from an edge of the display module by a fifth length, and the fifth length may be equal to a value obtained by dividing a sound speed in the display module by a natural frequency of the display module.

In an embodiment, the first vibration attenuating line may be an opening defined in the first cushion layer.

In an embodiment, the adhesive member may include a blocking base portion and a blocking protrusion portion protruding from the blocking base portion.

In an embodiment, the blocking base portion may couple the display module to the first cushion layer. The blocking protrusion portion may protrude from the blocking base portion into the opening.

In an embodiment, the first cushion layer may include a base cushion portion and a protruding portion protruding from the base cushion portion. The first vibration attenuating line may be the protruding portion.

In an embodiment, the first pattern may further include an auxiliary vibration attenuating line parallel to the first vibration attenuating line. A portion of the display module overlapped with the auxiliary vibration attenuating line may be spaced apart from the edge of the display module by a second length that is half a first length.

In an embodiment, the first pattern may further include a first auxiliary vibration attenuating line, a second auxiliary vibration attenuating line, and a third auxiliary vibration attenuating line. The first auxiliary vibration attenuating line may be parallel to the first vibration attenuating line, the second auxiliary vibration attenuating line may be between the first vibration attenuating line and the first auxiliary vibration attenuating line, and the third auxiliary vibration attenuating line may be between the first auxiliary vibration attenuating line and the edge.

In an embodiment, a portion of the display module overlapped with the first auxiliary vibration attenuating line may be spaced apart from the edge of the display module by a second length that is half a first length. Each of portions of the display module, which are respectively overlapped with the second auxiliary vibration attenuating line and the third auxiliary vibration attenuating line, may be spaced apart from the first auxiliary vibration attenuating line by a third length that is half the second length.

In an embodiment, the display device may further include a second cushion layer, which is in contact with the first cushion layer, and in which a second pattern is defined. When viewed in a plan view, the second pattern may include a second vibration attenuating line, which is inclined at an acute angle to the first vibration attenuating line.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
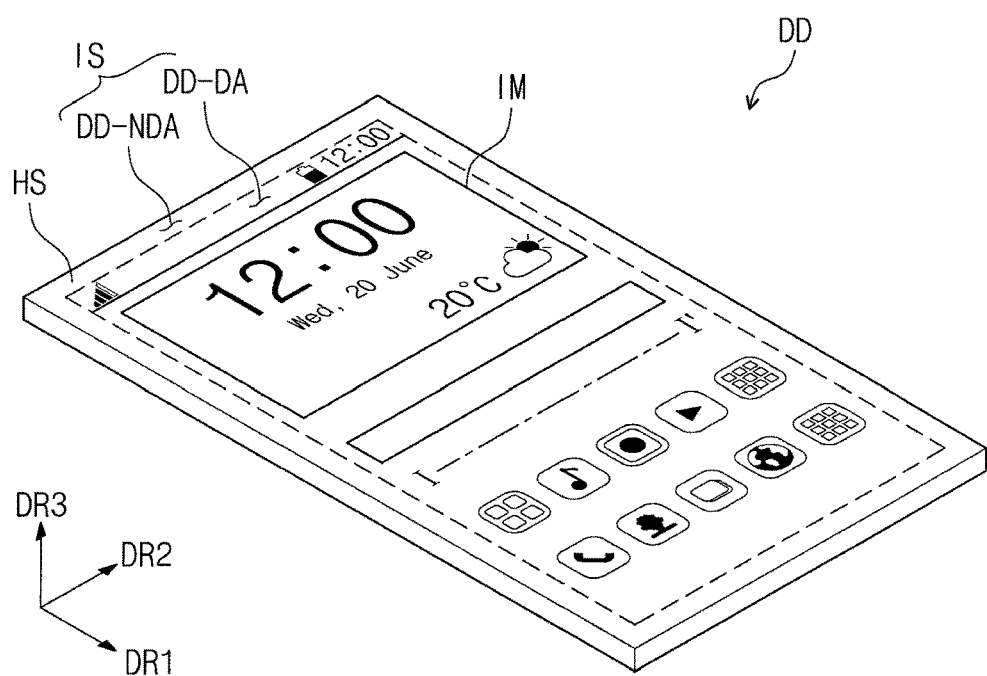
FIG. 1 is a perspective view of a display device according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of like or identical reference numbers in the various drawings is intended to indicate the presence of a like or identical element or feature.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art.

Expressions such as "at least one of", "one of" or "selected from" when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "below," "lower," "above," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

The electronic or electric devices and/or any other relevant devices or components according to embodiments of the present disclosure described herein, such as, for example, an external controller, a timing controller, power management circuit, a data driver, and a gate driver, may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of ordinary skill in the art should recognize that the functionality of various computing/electronic devices may be combined or integrated into a single computing/electronic device, or the functionality of a particular computing/electronic device may be distributed across one or more other computing/electronic devices without departing from the spirit and scope of the present disclosure.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the present specification, the expression "an element B may be directly provided on an element A" refers to that an adhesive layer/member is not provided between the elements A and B. In other words, the expression "an element B may be directly provided on an element A" refers to that the elements A and B are in contact with each other.

FIG. 1 is a perspective view illustrating a display device DD according to an embodiment of the inventive concept. As shown in FIG. 1, the display device DD may include a display surface IS, which is used to display an image IM. The display surface IS may be parallel to a first direction axis DR1 and/or a second direction axis DR2. A normal direction of the display surface IS (i.e., a thickness direction of the display device DD) may be in the same direction as a third direction axis DR3.

In the following description, the third direction axis DR3 may be used to differentiate a front or top surface of each element from a back or bottom surface of each element. However, directions indicated by the first to third direction axes DR1, DR2, and DR3 may be relative and may not be limited to the above example. In certain embodiments, directions indicated by the first to third direction axes DR1, DR2, and DR3 may be changed to indicate other directions. Hereinafter, first to third directions may be directions indicated by the first to third direction axes DR1, DR2, and DR3, respectively, and will be identified with the same reference numbers.

In FIG. 1, the display device DD is illustrated to have a flat display surface, but the inventive concept is not limited thereto. For example, the display surface of the display device DD may have a three-dimensional shape (e.g., a curved shape or a polygonal shape). In the case where the display device DD has the three-dimensional display surface, the display surface may include a plurality of display regions that are oriented in different directions. For example, the display device DD may have a display surface that is shaped like a polygonal pillar.

In the present embodiment, the display device DD may be a rigid display device. However, the inventive concept is not limited thereto, and in an embodiment, the display device DD may be a flexible display device. In the present embodiment, the display device DD, which can be used for a portable terminal, is exemplarily illustrated. Although not shown, the portable terminal may further include an electronic module, a camera module, a power module, and/or so forth, which may be mounted on a mainboard and may be provided in a housing member HS. The display device DD may be used for large-sized electronic devices (e.g., television sets and monitors) or small- or medium-sized electronic devices (e.g., tablets, car navigation systems, game machines, and smart watches).

As shown in FIG. 1, the display surface IS may include a display region DD-DA, which may be used to display an image IM, and a non-display region DD-NDA, which may be adjacent to the display region DD-DA. The non-display region DD-NDA may not be used to display an image. As an example of the image IM, icon images are shown in FIG. 1.

As shown in FIG. 1, the display region DD-DA may have a rectangular or tetragonal shape. The non-display region DD-NDA may be provided to enclose the display region DD-DA. However, the inventive concept is not limited to this example, and in an embodiment, shapes of the display and non-display regions DD-DA and DD-NDA may be changed in a complementary manner.

Figure 2:
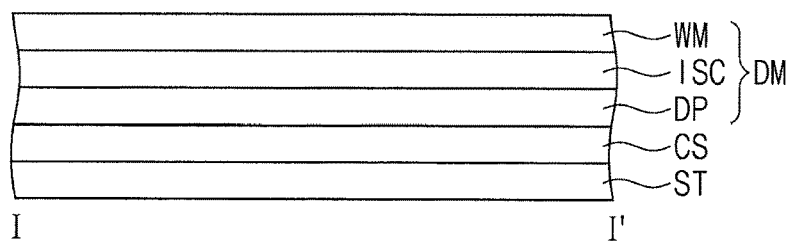
FIG. 2 is a sectional view taken along the line I-I' of FIG. 1.
Figure 2:
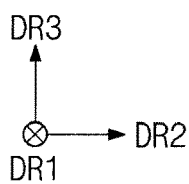

FIG. 2 is a sectional view taken along line I-I' of FIG. 1. For a better understanding of a stacking structure of the display device DD, the display device DD is illustrated in a simplified manner in FIG. 2.

In an embodiment, the display device DD may include a cushion layer CS and a display module DM. The display module DM may include a display panel DP, an input-sensing circuit ISC, and a window substrate WM. The display device DD may further include a supporting member ST.

At least two elements of the supporting member ST, the cushion layer CS, the display panel DP, the input-sensing circuit ISC, and the window substrate WM may be formed by a successive process (e.g., formed directly on another element) or may be combined with each other by an adhesive member. The adhesive member may be an optically transparent adhesive member, but the inventive concept is not limited thereto. In an embodiment, the adhesive member may include suitable glues and/or adhesives.

The cushion layer CS may be on the supporting member ST, the display panel DP may be on the cushion layer CS, the input-sensing circuit ISC may be on the display panel DP, the window substrate WM may be on the input-sensing circuit ISC, but the inventive concept is not limited thereto.

In an embodiment, the input-sensing circuit ISC may be directly on the display panel DP. However, the inventive concept is not limited thereto, and in an embodiment, the input-sensing circuit ISC may be attached to the display panel DP by an adhesive member.

In an embodiment, the supporting member ST may support the display module DM. The supporting member ST may be a portion of the housing member HS shown in FIG. 1. The display panel DP may be configured to generate the image IM.

In an embodiment, the display panel DP may be a light-emitting type display panel, but the inventive concept is not limited to a specific type of the display panel DP. For example, the display panel DP may be an organic light emitting display panel and/or a quantum dot light emitting display panel. A light emitting layer of the organic light emitting display panel may include an organic light emitting material. A light emitting layer of the quantum dot light emitting display panel may include a quantum dot, a quantum rod, and/or the like. For the sake of simplicity, the description that follows will refer to an example in which the display panel DP is an organic light emitting display panel.

The input-sensing circuit ISC may be configured to obtain information on coordinates of an external input (e.g., a touch event). The input-sensing circuit ISC may be configured to sense a change in electrostatic capacitance caused by an external object and to determine whether there is an external input from the external object. This sensing method of the input-sensing circuit ISC may be called "a capacitance-sensing method."

In an embodiment, the input-sensing circuit ISC may be configured to sense a change in pressure caused by an external object and to determine whether there is an external input from the external object. This sensing method of the input-sensing circuit ISC may be called "a pressure-sensing method."

The window substrate WM may be configured to protect the display module DM against an external impact and to provide an input surface for a user. The window substrate WM may include a glass and/or a plastic material. The window substrate WM may have a transparent property such that light generated in the display panel DP can pass through the window substrate WM.

Figure 3:
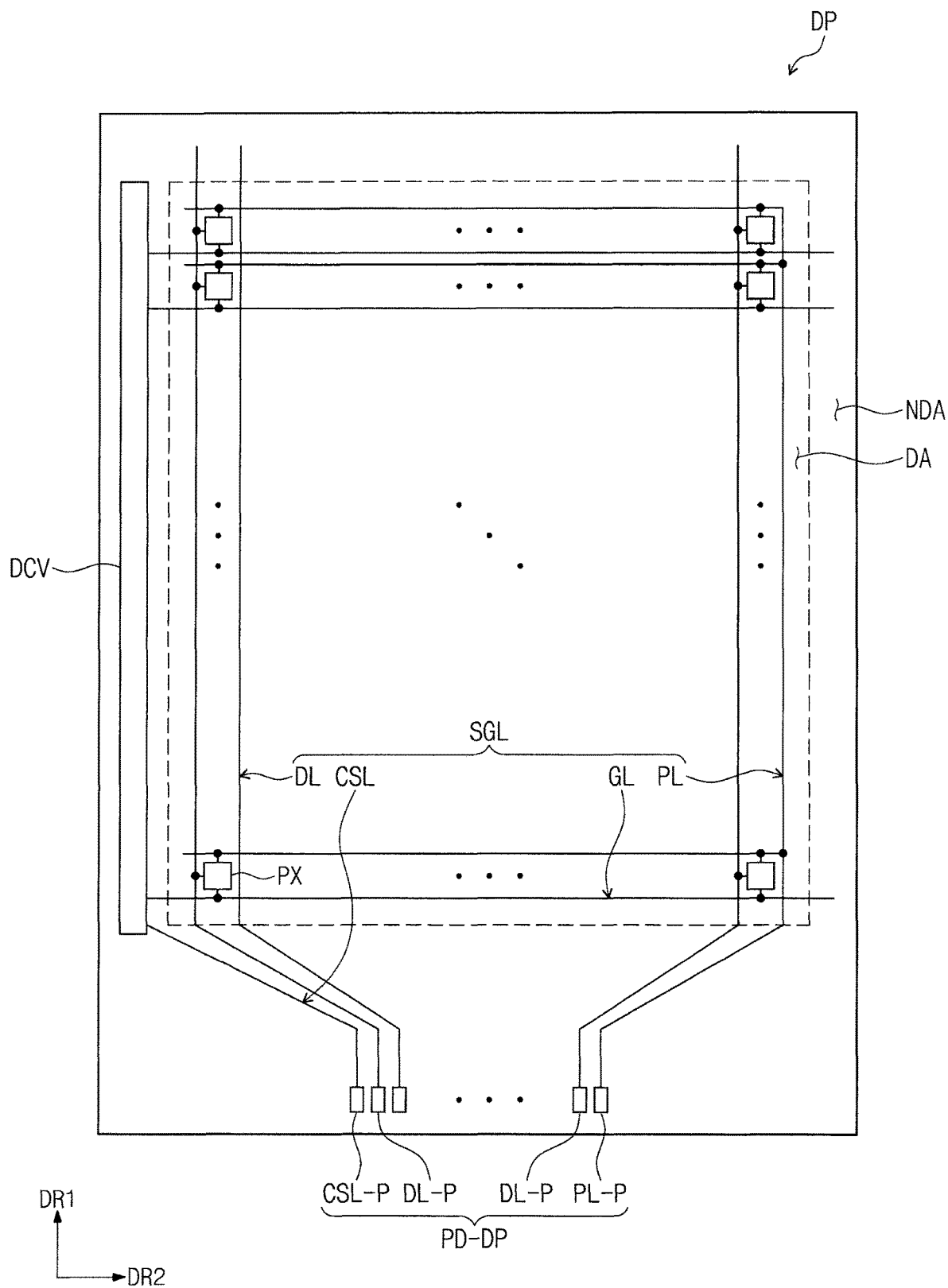
FIG. 3 is a plan view of a display panel according to an embodiment of the inventive concept.
Figure 4:
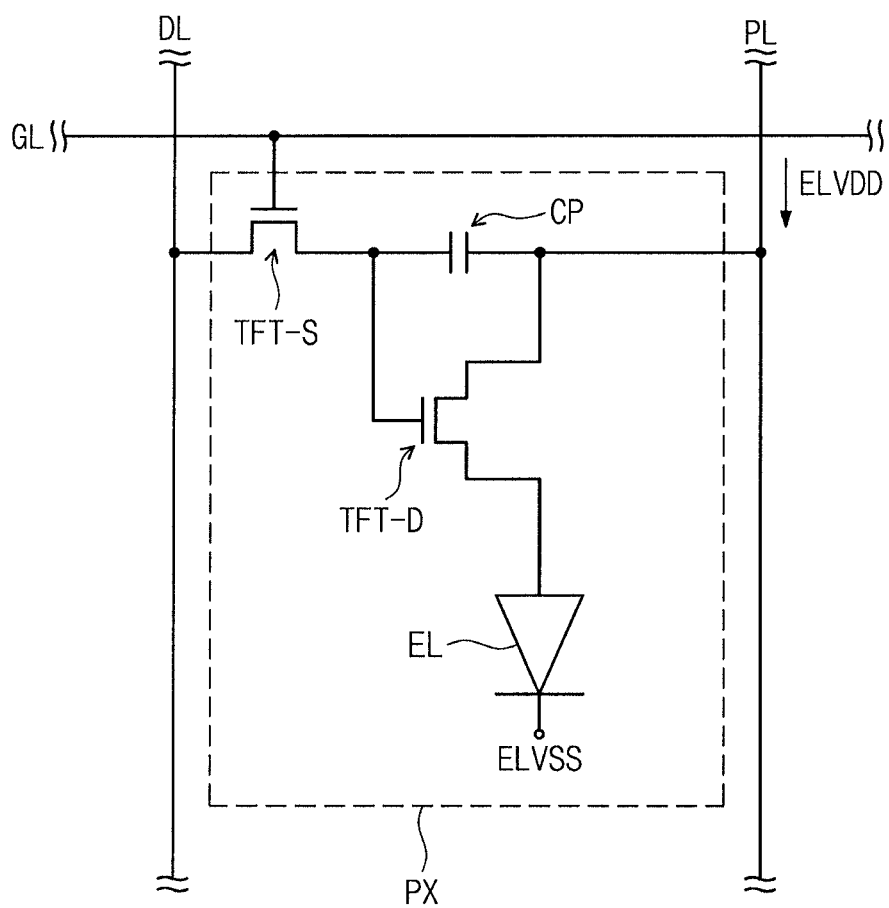
FIG. 4 is a circuit diagram of a pixel according to an embodiment of the inventive concept.

FIG. 3 is a plan view of the display panel DP according to an embodiment of the inventive concept. FIG. 4 is a circuit diagram of a pixel PX according to an embodiment of the inventive concept.

Referring to FIG. 3, the display panel DP may include a display region DA and a non-display region NDA. The display region DA and the non-display region NDA of the display panel DP may correspond to the display region DD-DA and the non-display region DD-NDA, respectively, of the display device DD (e.g., see FIG. 1). In certain embodiments, the display region DA and the non-display region NDA of the display panel DP may not be the same as the display region DD-DA and the non-display region DD-NDA of the display device DD and may be changed according to the structure or design of the display panel DP.

The display panel DP may include a plurality of signal lines SGL and a plurality of pixels PX. A region, on which the plurality of pixels PX are provided, may be defined as the display region DA. In the present embodiment, the non-display region NDA may be defined along an edge, perimeter, or circumference of the display region DA.

The signal lines SGL may include gate lines GL, data lines DL, a power line PL, and a control signal line CSL. Each of the gate lines GL may be connected to corresponding ones of the plurality of pixels PX, and each of the data lines DL may be connected to corresponding ones of the plurality of pixels PX. The power line PL may be connected to the plurality of pixels PX. A gate driving circuit DCV, to which the gate lines GL are connected, may be at a side region of the non-display region NDA. The control signal line CSL may be used to provide control signals to the gate driving circuit DCV.

Some of the gate lines GL, the data lines DL, the power line PL, and the control signal line CSL may be provided on the same layer, and at least one of the gate lines GL, the data lines DL, the power line PL, and the control signal line CSL may be provided on a layer different from that of the others.

Each of the gate lines GL, the data lines DL, the power line PL, and the control signal line CSL may include a signal line portion and a display panel pad from among the display panel pads PD-DP connected to an end of each signal line portion. Each signal line portion may be defined as a portion of each of the gate lines GL, the data lines DL, the power line PL, and the control signal line CSL, not including the display panel pads PD-DP.

The display panel pads PD-DP may be formed by the same process as the transistors for driving the pixels PX. For example, the display panel pads PD-DP may be formed by a low temperature polycrystalline silicon (LTPS) process and/or a low temperature polycrystalline oxide (LTPO) process.

In an embodiment, the display panel pads PD-DP may include a control pad CSL-P, a data pad DL-P, and/or a power pad PL-P. In one embodiment, a gate pad may be overlapped with and connected to (e.g., electrically connected to) the gate driving circuit DCV. In one embodiment, a portion of the non-display region NDA in which the control pad CSL-P, the data pad DL-P, and the power pad PL-P are aligned may be defined as a pad region.

The display panel pads PD-DP may be used to receive electrical signals from the outside and to transfer the received signals to the pixels PX or the gate driving circuit DCV.

Referring to FIG. 3, a top-side region, a bottom-side region, a left-side region, and a right-side region may be defined in the display panel DP. The bottom-side region of the display panel DP may be defined as a region including the display panel pads PD-DP. The top-side region of the display panel DP may be defined as a region that is opposite to the bottom-side region of the display panel DP.

In FIG. 3, the left-side region of the display panel DP may be defined as a region including the gate driving circuit DCV. The right-side region of the display panel DP may be defined as a region that is opposite to the left-side region of the display panel DP.

In the present specification, an upward direction, a downward direction, a leftward direction, and a rightward direction will be respectively used to indicate directions toward the top-side region, the bottom-side region, the left-side region, and the right-side region of the display panel DP.

However, the top-side region, the bottom-side region, the left-side region, and the right-side region of the display panel DP are not limited to the above example and may be used to indicate other regions of the display panel DP.

FIG. 4 illustrates a circuit diagram of one of the pixels PX that is connected to one of the gate lines GL, one of the data lines DL, and the power line PL according to an exemplary embodiment of the present inventive concept. However, the inventive concept is not limited thereto, and the circuit diagram of the pixel PX may vary.

The pixel PX may include a light-emitting device EL, which may serve as a display element. The light-emitting device EL may be a top-emission type diode or a bottom-emission type diode. In certain embodiments, the light-emitting device EL may be a double-sided emission type diode. The light-emitting device EL may be an organic light emitting diode. The pixel PX may include a switching transistor TFT-S, a driving transistor TFT-D, and a capacitor CP, which are used as a circuit for driving the light-emitting device EL. The light-emitting device EL may generate light in response to electrical signals transmitted from the transistors TFT-S and TFT-D.

The switching transistor TFT-S may be configured to output a data signal applied to the data line DL in response to a scan signal applied to the gate line GL. The capacitor CP may be charged to a voltage level corresponding to the data signal received through the switching transistor TFT-S.

The driving transistor TFT-D may be connected to the light-emitting device EL. The driving transistor TFT-D may control a driving current passing through the light-emitting device EL based on an amount of electric charge stored in the capacitor CP. The light-emitting device EL may emit light while the driving transistor TFT-D is in an on state.

The power line PL may be used to supply a first power voltage ELVDD to the light-emitting device EL.

Figure 5:
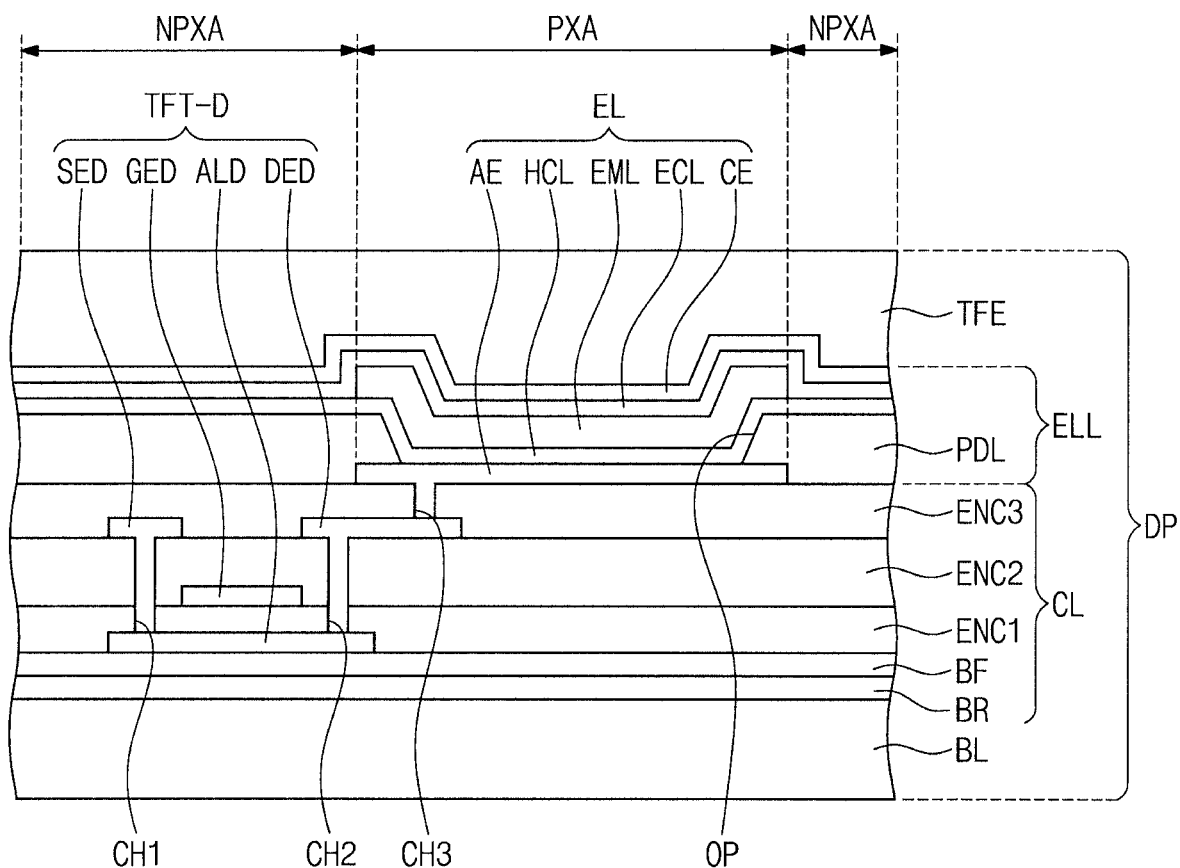
FIG. 5 is a sectional view illustrating a portion of a pixel according to an embodiment of the inventive concept.

FIG. 5 is a sectional view illustrating a portion of the pixel PX according to an embodiment of the inventive concept. FIG. 5 illustrates a vertical section of a region corresponding to the driving transistor TFT-D and the light-emitting device EL shown in FIG. 4.

As shown in FIG. 5, a circuit layer CL may be on a base layer BL. A semiconductor pattern ALD of the driving transistor TFT-D may be on the base layer BL. The semiconductor pattern ALD may be formed of or include at least one of amorphous silicon, polysilicon, or metal oxide semiconductor materials.

The circuit layer CL may include organic/inorganic layers (e.g., BR, BF, ENC1, ENC2, and ENC3), the switching transistor TFT-S (e.g., see FIG. 4), and the driving transistor TFT-D. The organic/inorganic layers may include a functional layer BR and BF, a first insulating layer ENC1, a second insulating layer ENC2, and a third insulating layer ENC3.

The functional layer (e.g., BR and BF) may be on a surface of the base layer BL. The functional layer may include a barrier layer BR and/or a buffer layer BF. The semiconductor pattern ALD may be on the barrier layer BR or the buffer layer BF.

The first insulating layer ENC1 may be on the base layer BL to cover the semiconductor pattern ALD. The first insulating layer ENC1 may include an organic layer and/or an inorganic layer. In particular, the first insulating layer ENC1 may include a plurality of inorganic thin films. The plurality of inorganic thin films may include a silicon nitride layer and/or a silicon oxide layer.

A control electrode GED of the driving transistor TFT-D may be on the first insulating layer ENC1. A control electrode of the switching transistor TFT-S (e.g., see FIG. 4) may also be on the first insulating layer ENC1. The control electrode GED and the gate line GL (e.g., see FIG. 4) may be formed by the same photolithography process. In other words, the control electrode GED and the gate lines GL may be formed of the same material and on the same layer and may have the same stacking structure.

The second insulating layer ENC2 may be provided on the first insulating layer ENC1 to cover the control electrode GED. The second insulating layer ENC2 may include an organic layer and/or an inorganic layer. In particular, the second insulating layer ENC2 may include a plurality of inorganic thin films. The plurality of inorganic thin films may include a silicon nitride layer and/or a silicon oxide layer.

The data line DL (e.g., see FIG. 4) may be provided on the second insulating layer ENC2. An input electrode SED and an output electrode DED of the driving transistor TFT-D may be provided on the second insulating layer ENC2. The switching transistor TFT-S may also include an input electrode and an output electrode that are provided on the second insulating layer ENC2. The input electrode SED may be a portion that is branched off from a corresponding one of the data lines DL. The power line PL (e.g., see FIG. 4) and the data lines DL may be on the same layer. The input electrode SED may be branched off from the power line PL.

A portion of an electrode of the capacitor CP may be on the second insulating layer ENC2. The portion of the electrode of the capacitor CP may be formed using the same photolithography process as that for the data lines DL and the power line PL. In this case, the portion of the electrode of the capacitor CP, the data lines DL, and the power line PL may be formed of the same material and on the same layer and may have the same stacking structure.

The input electrode SED and the output electrode DED may be connected to respective portions of the semiconductor pattern ALD through a first through hole CH1 and a second through hole CH2, which may penetrate (e.g., extend through) both of the first insulating layer ENC1 and the second insulating layer ENC2. In an embodiment, the switching transistor TFT-S and the driving transistor TFT-D may be configured to have a bottom gate structure.

The third insulating layer ENC3 may be provided on the second insulating layer ENC2 to cover the input electrode SED and the output electrode DED. The third insulating layer ENC3 may include an organic layer and/or an inorganic layer. In particular, the third insulating layer ENC3 may include an organic material and may be formed to have a flat top surface.

According to a circuit structure of the pixel, one of the first insulating layer ENC1, the second insulating layer ENC2, and the third insulating layer ENC3 may be excluded. Each of the second insulating layer ENC2 and the third insulating layer ENC3 may be defined as an interlayered insulating layer. The interlayered insulating layer may be provided between vertically-separated conductive patterns and may be used to electrically disconnect (e.g., electrically insulate) the conductive patterns from each other.

A light emitting device layer ELL may be provided on the third insulating layer ENC3. The light emitting device layer ELL may include a pixel definition layer PDL and the light-emitting device EL. An anode AE may be provided on the third insulating layer ENC3. The anode AE may be connected to the output electrode DED of the driving transistor TFT-D through a third through hole CH3, which may penetrate (e.g., extend through) the third insulating layer ENC3. An opening OP may be defined in the pixel definition layer PDL. The opening OP of the pixel definition layer PDL may expose a portion of the anode AE.

The light emitting device layer ELL may include a light-emitting region PXA and a non-light-emitting region NPXA adjacent to the light-emitting region PXA. The non-light-emitting region NPXA may be provided to enclose the light-emitting region PXA. In the present embodiment, the light-emitting region PXA may be defined to correspond to the anode AE. However, the shape or position of the light-emitting region PXA is not limited thereto, and the light-emitting region PXA may be defined as a region, from which light is emitted. In an embodiment, the light-emitting region PXA may be defined to correspond to the portion of the anode AE exposed by the opening OP.

A hole control layer HCL may be provided in common on the light-emitting region PXA and the non-light-emitting region NPXA. A common layer, such as the hole control layer HCL, may be provided in common on a plurality of the pixels PX (e.g., see FIG. 3).

A light emitting layer EML may be on the hole control layer HCL. The light emitting layer EML may be on only a region corresponding to the opening OP. In other words, the light emitting layer EML may be divided into a plurality of patterns that are formed in the plurality of pixels PX, respectively.

The light emitting layer EML may be formed of or include an organic material and/or an inorganic material.

An electron control layer ECL may be on the light emitting layer EML. A cathode CE may be on the electron control layer ECL. The cathode CE may be provided in common on the plurality of pixels PX.

In the present embodiment, the light emitting layer EML is illustrated to have a patterned structure, but in an embodiment, the light emitting layer EML may be provided in common on the plurality of pixels PX. Here, the light emitting layer EML may be configured to emit a white-color light. In an embodiment, the light emitting layer EML may have a multi-layered structure.

In the present embodiment, a thin encapsulation layer TFE may directly cover the cathode CE. In an embodiment, a capping layer may be further provided to cover the cathode CE. In this case, the thin encapsulation layer TFE may be provided to directly cover the capping layer. The thin encapsulation layer TFE may include at least one of organic or inorganic layers.

In an embodiment, the base layer BL of the display panel DP may be excluded.

Figure 6A:
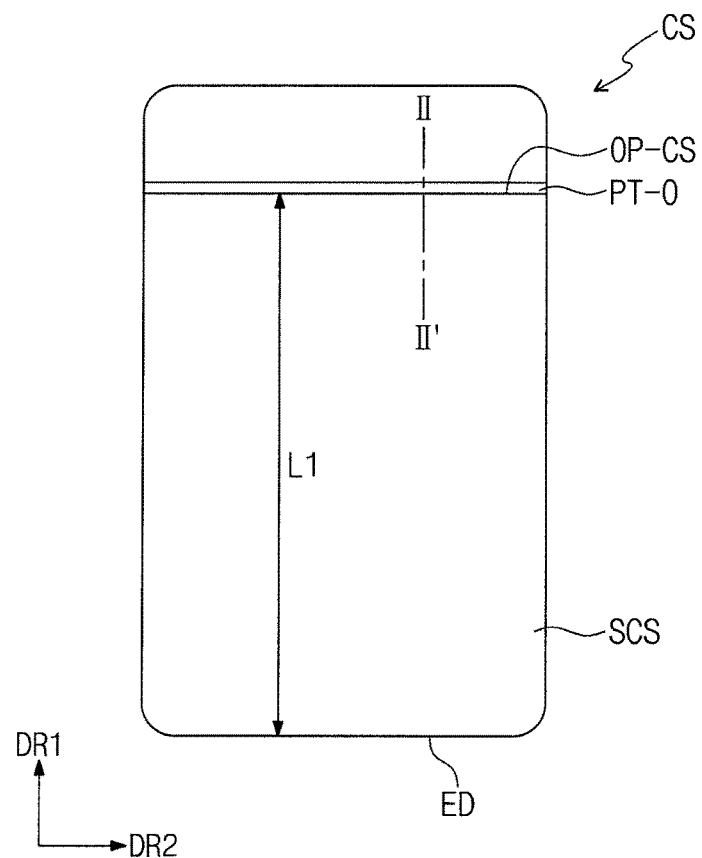
FIG. 6A is a plan view illustrating a cushion layer according to an embodiment of the inventive concept.
Figure 6B:
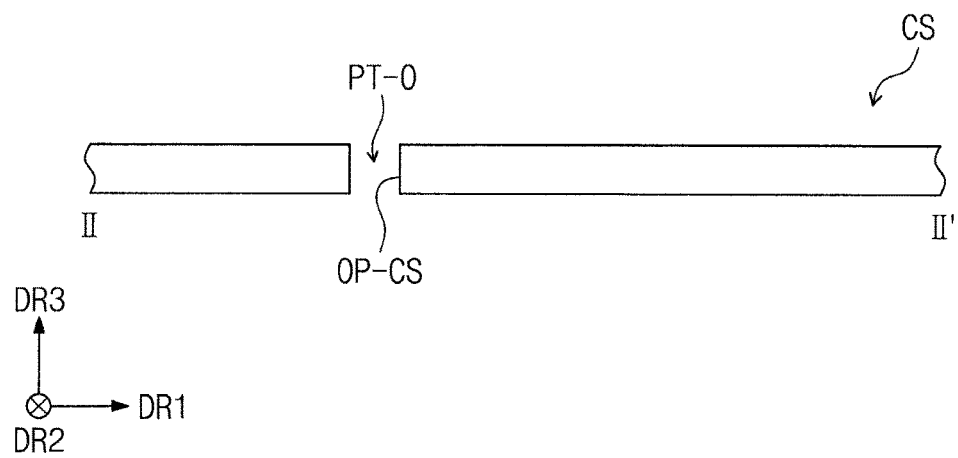
FIG. 6B is a sectional view taken along the line II-II' of FIG. 6A.

FIG. 6A is a plan view of the cushion layer CS according to an embodiment of the inventive concept. FIG. 6B is a sectional view taken along line II-II' of FIG. 6A.

Referring to FIG. 6A, a pattern PT-O, which includes a vibration attenuating line extending in a specific direction, may be defined in the cushion layer CS. The specific direction may be parallel to a first direction DR1 or a second direction DR2 or may be inclined at an acute angle to the first or the second direction DR1 or DR2, but the inventive concept is not limited thereto.

In the present specification, the term "pattern", such as the pattern PT-O defined in the cushion layer CS, may represent a structure including one or more vibration attenuating lines. For example, in the case where the number of the vibration attenuating lines is one, the pattern PT-O may be the vibration attenuating line, and in the case where the number of vibration attenuating lines is more than one, the pattern PT-O may represent a structure including a plurality of vibration attenuating lines. Hereinafter, although not described separately, the above description may be applied to each of patterns PT-P, PT-O1, PT-P1, PT-O2, PT-P2, PT-O3, PT-O4, and PT defined in the cushion layer CS.

In an embodiment, the cushion layer CS may have an elastic property. The cushion layer CS may be formed of or include at least one selected from the group consisting of urethane, rubber, synthetic resin, and hydrocarbon compounds.

However, the inventive concept is not limited to the above materials of the cushion layer CS, and various impact-reducing materials may be suitably used for the cushion layer CS.

In an embodiment, a thickness of the cushion layer CS may range from 30 μm to 500 μm, but the inventive concept is not limited thereto. The thickness of the cushion layer CS may be adjusted depending on a size of the display device DD and physical characteristics of the display module DM.

Referring to FIG. 6B, the pattern PT-O may be defined by an opening OP-CS (e.g., a recess). The cushion layer CS may be divided into two sub-cushion layers SCS by the pattern PT-O. However, the inventive concept is not limited thereto, and the cushion layer CS may be divided into three or more sub-cushion layers SCS, according to the number of the vibration attenuating lines included in the pattern PT-O. The sub-cushion layers SCS may differ from each other in terms of size or shape.

The opening OP-CS may be formed by physically polishing the cushion layer CS, but the inventive concept is not limited thereto. For example, the opening OP-CS may be formed by various methods known in the art. The opening OP-CS may be formed by, for example, an etching process.

As shown in FIGS. 6A-6B, the pattern PT-O defined by the opening OP-CS may be called an opening-type pattern, in the present specification.

The pattern PT-O may be spaced apart from an edge ED of the cushion layer CS by a first length L1. In an embodiment, the edge ED may be a portion corresponding to a corner or side of the cushion layer CS.

In FIG. 6A, the edge ED is illustrated as a lower side of the cushion layer CS extending parallel to the second direction DR2 (e.g., extending in the same direction as second direction DR2).

$$L1 = \lambda = \frac{v}{f} \quad \text{[Formula 1]}$$

As expressed by the Formula 1, a first length L1 may be a value obtained by dividing a sound speed (v) (e.g., speed of sound) in the display module DM by a natural frequency (f) of the display module DM.

In the present specification, a value obtained by dividing a sound speed in a specific object by a natural frequency of the specific object may be defined as a wavelength (λ) of "a standing wave having a natural frequency" (hereinafter, called "standing wave") in the specific object. That is, a value obtained by dividing a sound speed (v) (e.g., speed of sound) in the display module DM by a natural frequency (f) of the display module DM may refer to (e.g., equal or correspond to) a wavelength (λ) of a standing wave in the display module DM. In other words, the first length L1 may have substantially the same value as the wavelength (λ) of the standing wave.

Vibration of an object may occur at a specific frequency, which is determined depending on its physical characteristics, and here, the frequency of the object may be defined as a natural frequency.

In an embodiment, a frequency of a wave, which is produced in the display module DM when an impact is exerted on the display module DM, was measured, and a frequency, which has the highest amplitude, from among the audible frequency band (e.g., from 20 Hz to 20000 Hz) was set to the natural frequency of the display panel DP.

In the present specification, the standing wave may be defined as a wave which oscillates in time but whose peak amplitude profile does not move in space.

In the case where an external force having the same frequency as a natural frequency of the display module DM is periodically exerted on the display module DM, the amplitude of the vibration of the display module DM may be increased by the resonance phenomenon, and this may lead to a physical damage (e.g., a crack) on the display module DM.

According to an embodiment of the inventive concept, the pattern PT-O may be formed to be spaced apart from the edge ED of the cushion layer CS by a wavelength of the standing wave in the display module DM. Thus, even if an external object collides with a side surface of the display device DD, an amplitude of a standing wave, whose frequency is the same as the natural frequency of the display module DM, is attenuated by the pattern PT-O defined in the cushion layer CS. Therefore the pattern PT-O defined in the cushion layer CS may prevent or suppress the standing wave from being formed in the display module DM. Accordingly, it may be possible to prevent or suppress the resonance phenomenon from occurring in the display module DM and to prevent or reduce damage to the display module DM caused by an external collision.

Although not described separately, the above description may be applied to each of patterns PT-O, PT-P, PT-O1, PT-P1, PT-O2, PT-P2, PT-O3, PT-O4, and PT defined in the cushion layer CS.

Figure 7A:
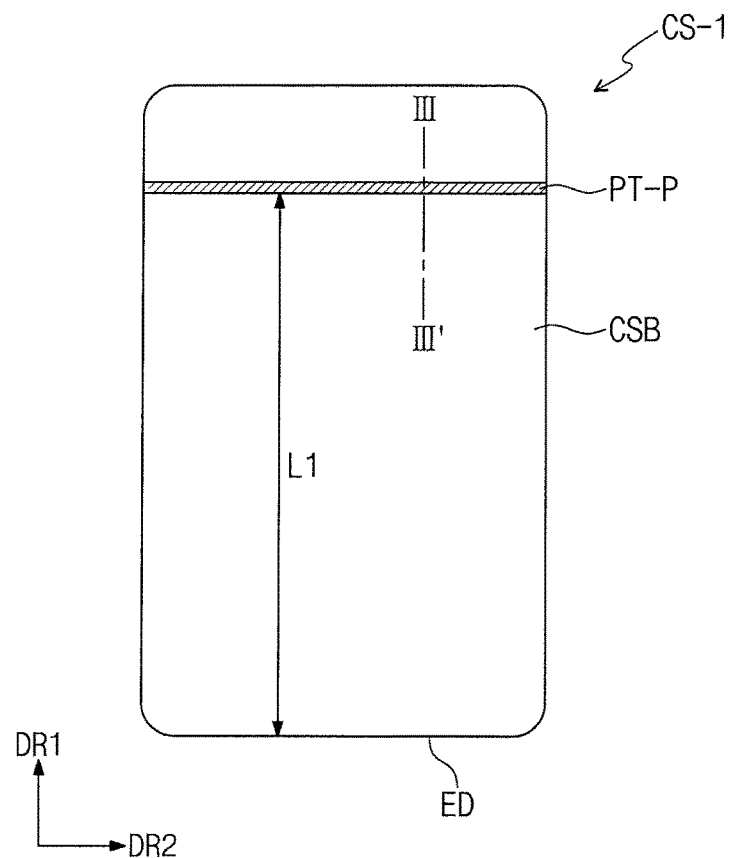
FIG. 7A is a plan view illustrating a cushion layer according to an embodiment of the inventive concept.
Figure 7B:
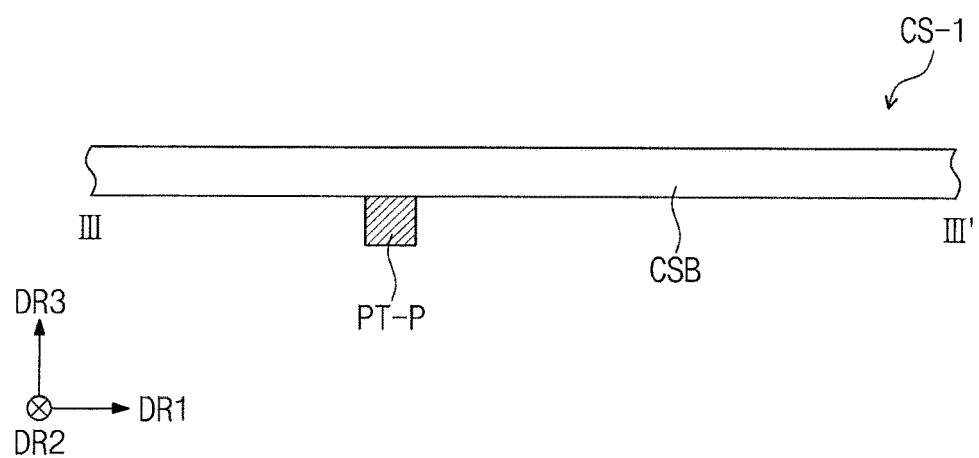
FIG. 7B is a sectional view taken along line III-III' of FIG. 7A.

FIG. 7A is a plan view of the cushion layer CS according to an embodiment of the inventive concept. FIG. 7B is a sectional view taken along line III-III' of FIG. 7A.

In FIG. 7A, a pattern PT-P may be spaced apart from an edge ED of a cushion layer CS-1 by the first length L1, and the first length L1 may be a value obtained by dividing a sound speed in the display module DM by a natural frequency of the display module DM.

Referring to FIG. 7B, the cushion layer CS-1 may include a base cushion layer CSB and a pattern PT-P. The pattern PT-P may be a vibration attenuating line defined by a protruding portion protruding from the base cushion layer CSB. In an embodiment, the protruding portion, the vibration attenuating line, and the pattern PT-P may refer to substantially the same element. The base cushion layer CSB and the protruding portion may constitute a single object (e.g., a single integral object).

As shown in FIGS. 7A-7B, the pattern PT-P defined by the protruding portion may be called a protrusion-type pattern, in the present specification.

Figure 8A:
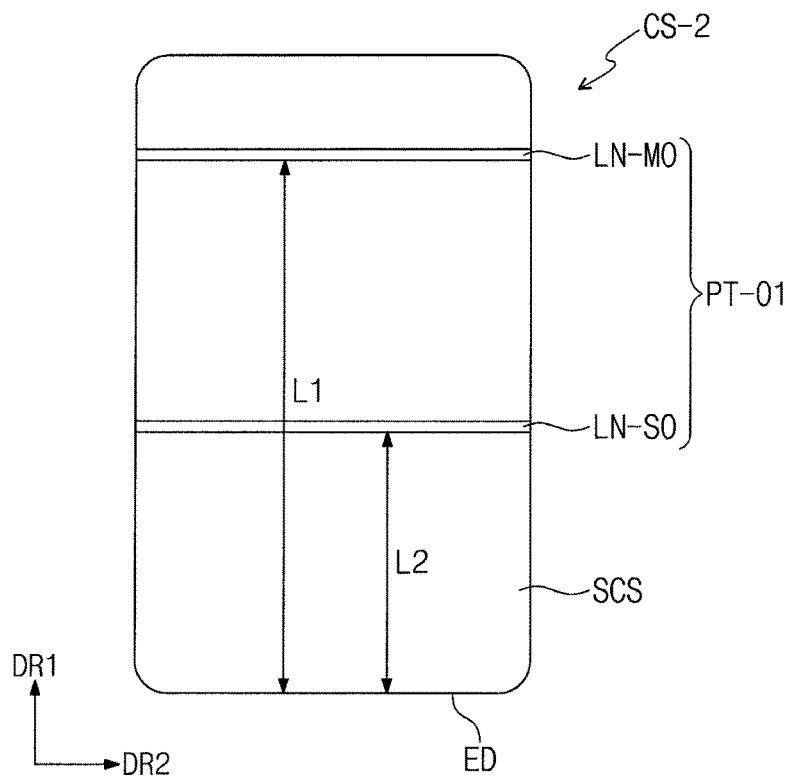
FIGS. 8A-8B, 9A-9B, and 10 are plan views each illustrating a cushion layer according to an embodiment of the inventive concept.
Figure 8B:
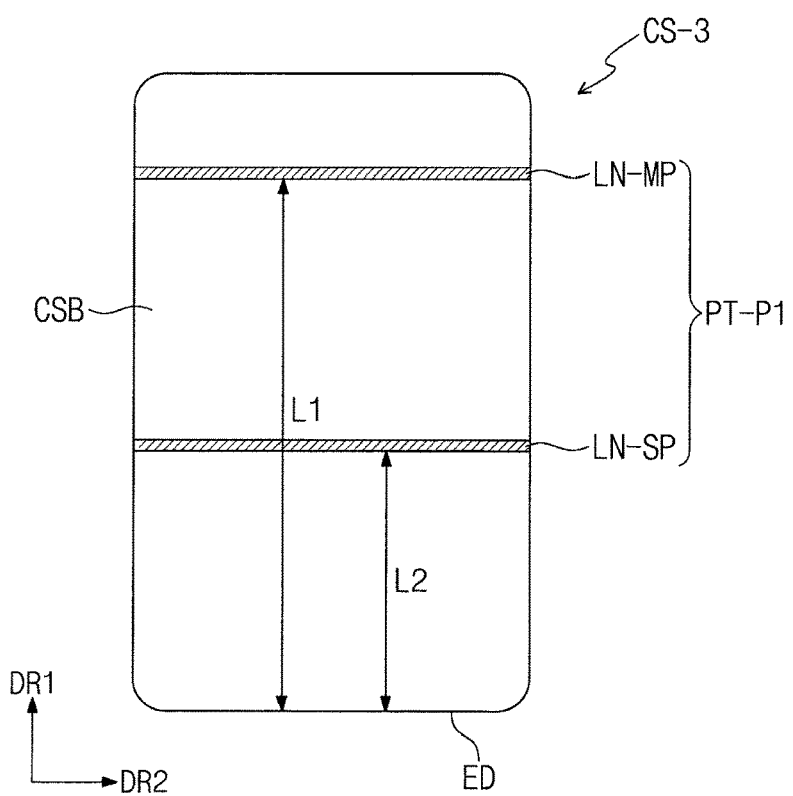

FIGS. 8A-8B are plan views each illustrating a respective cushion layer CS-2 and CS-3 according to an embodiment of the inventive concept. FIG. 8A illustrates an embodiment including an opening-type pattern, and FIG. 8B illustrates an embodiment including a protrusion-type pattern.

Referring to FIG. 8A, a pattern PT-O1 defined in the cushion layer CS-2 may include a vibration attenuating line LN-MO (e.g., an opening or a recess) and an auxiliary vibration attenuating line LN-SO (e.g., an opening or a recess). The cushion layer CS-2 may be divided into three sub-cushion layers SCS by the pattern PT-O1.

The vibration attenuating line LN-MO may be spaced apart from the edge ED by the first length L1. The auxiliary vibration attenuating line LN-SO may be parallel to the vibration attenuating line LN-MO and may be spaced apart from the edge ED by a second length L2, which may be half the first length L1.

Referring to FIG. 8B, a pattern PT-P1 defined in the cushion layer CS-3 may include a vibration attenuating line LN-MP (e.g., a protrusion) and an auxiliary vibration attenuating line LN-SP (e.g., a protrusion).

The vibration attenuating line LN-MP may be spaced apart from the edge ED by the first length L1. The auxiliary vibration attenuating line LN-SP may be parallel to the vibration attenuating line LN-MP and may be spaced apart from the edge ED by the second length L2, which may be half the first length L1.

The vibration attenuating line LN-SO or LN-SP may be at a position that is spaced apart from the edge ED of the cushion layer CS-2 or CS-3 by half the wavelength of the standing wave. This may make it possible to more effectively suppress the standing wave from being produced by an external collision and to prevent or reduce damage to the display module DM.

Figure 9A:
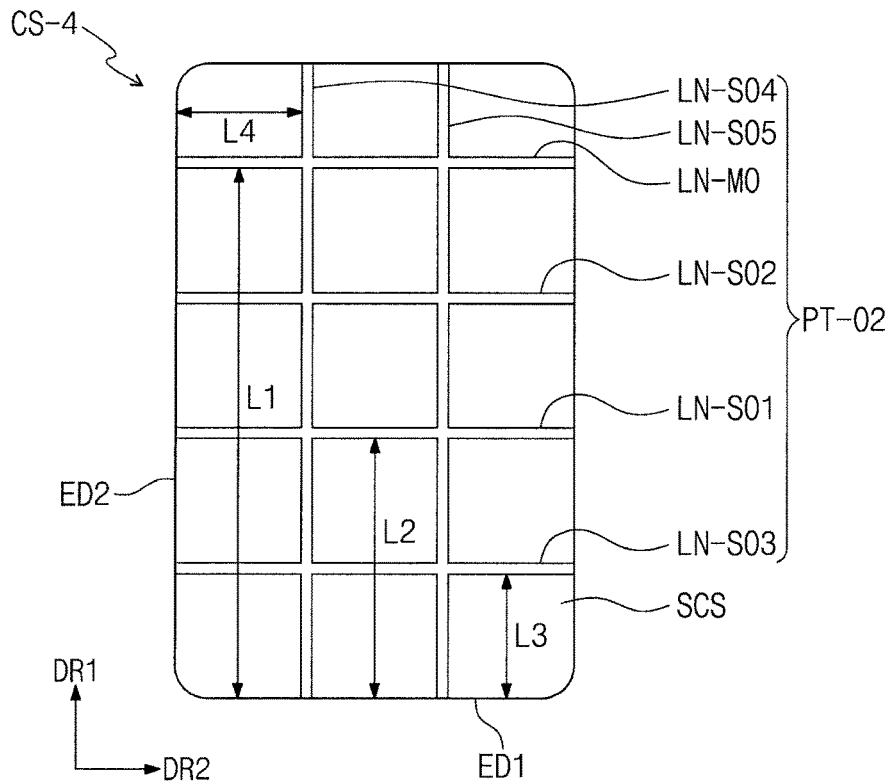
Figure 9B:
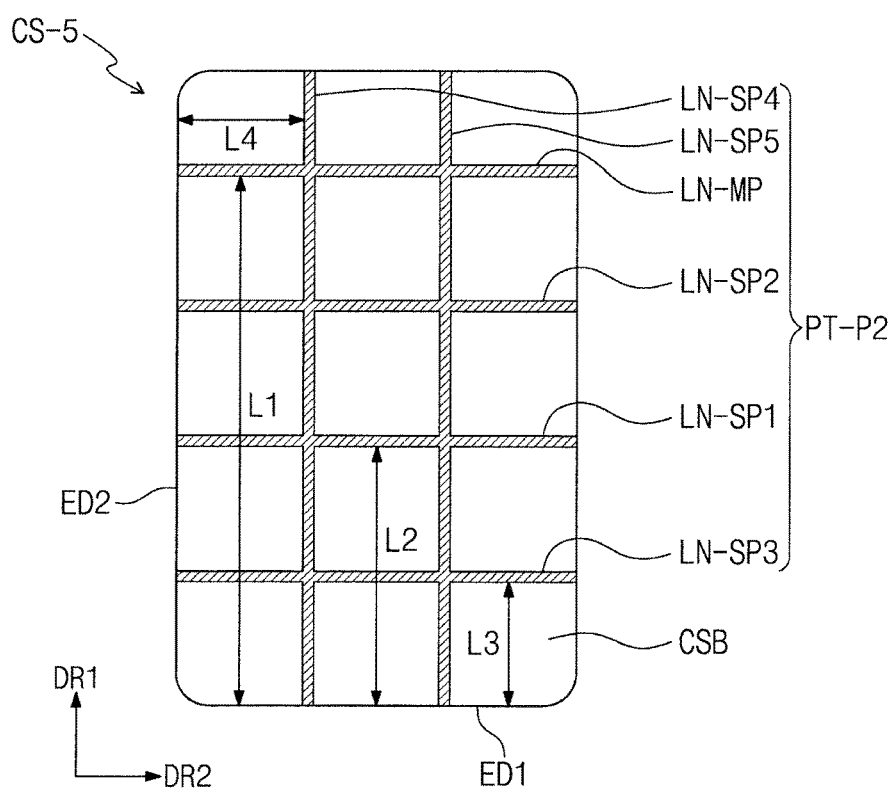

FIGS. 9A-9B are plan views each illustrating a cushion layer CS-4 or CS-5 according to an embodiment of the inventive concept. FIG. 9A illustrates an embodiment including an opening-type pattern, and FIG. 9B illustrates an embodiment including a protrusion-type pattern.

Referring to FIG. 9A, a pattern PT-O2 defined in the cushion layer CS-4 may include a vibration attenuating line LN-MO, a first auxiliary vibration attenuating line LN-SO1, a second auxiliary vibration attenuating line LN-SO2, a third auxiliary vibration attenuating line LN-SO3, a fourth auxiliary vibration attenuating line LN-SO4, and a fifth auxiliary vibration attenuating line LN-SO5. The cushion layer CS-4 may be divided into fifteen sub-cushion layers SCS by the pattern PT-O2.

The vibration attenuating line LN-MO may be spaced apart from the edge ED by the first length L1. The first auxiliary vibration attenuating line LN-SO1 may be parallel to the vibration attenuating line LN-MO and may be spaced apart from an edge ED1 by the second length L2, which may be half the first length L1. The second auxiliary vibration attenuating line LN-SO2 and the third auxiliary vibration attenuating line LN-SO3 may be parallel to the vibration attenuating line LN-MO and may be spaced apart from the first auxiliary vibration attenuating line LN-SO1 by a third length L3, which may be half the second length L2. One of the second auxiliary vibration attenuating line LN-SO2 and the third auxiliary vibration attenuating line LN-SO3 may be between the first auxiliary vibration attenuating line LN-SO1 and the vibration attenuating line LN-MO, and the other may be provided between the first auxiliary vibration attenuating line LN-SO1 and the edge ED1.

At least one of the fourth auxiliary vibration attenuating line LN-SO4 and the fifth auxiliary vibration attenuating line LN-SO5 may be spaced apart from another edge ED2 of the cushion layer CS-4 by a fourth length L4.

The fourth auxiliary vibration attenuating line LN-SO4 may be spaced apart from the another edge ED2 of the cushion layer CS-4 by the fourth length L4, and the fifth auxiliary vibration attenuating line LN-SO5 may be spaced apart from the fourth auxiliary vibration attenuating line LN-SO4 by the fourth length L4 and may be spaced apart from the another edge ED2 by two times the fourth length L4.

The fourth length L4 may be substantially equal to one selected from the first length L1, the second length L2, and the third length L3.

Referring to FIG. 9B, a pattern PT-P2 defined in the cushion layer CS-5 may include a vibration attenuating line LN-MP, a first auxiliary vibration attenuating line LN-SP1, a second auxiliary vibration attenuating line LN-SP2, a third auxiliary vibration attenuating line LN-SP3, a fourth auxiliary vibration attenuating line LN-SP4, and a fifth auxiliary vibration attenuating line LN-SP5.

Except that the pattern PT-P2 is a protrusion-type pattern, the cushion layer CS-5 of FIG. 9B may be configured to have substantially the same features as the cushion layer CS-4 of FIG. 9A, and thus, a previously described element may be identified by the same reference number without repeating an overlapping description thereof.

In a region, which is spaced apart from the edge ED of the cushion layer CS-4 or CS-5, the pattern PT-O2 or PT-P2 may be provided in consideration of the wavelength of the standing wave. Accordingly, it may be possible to effectively prevent or suppress the standing wave from being produced by an external collision and to prevent or reduce damage to the display module DM.

Figure 10:
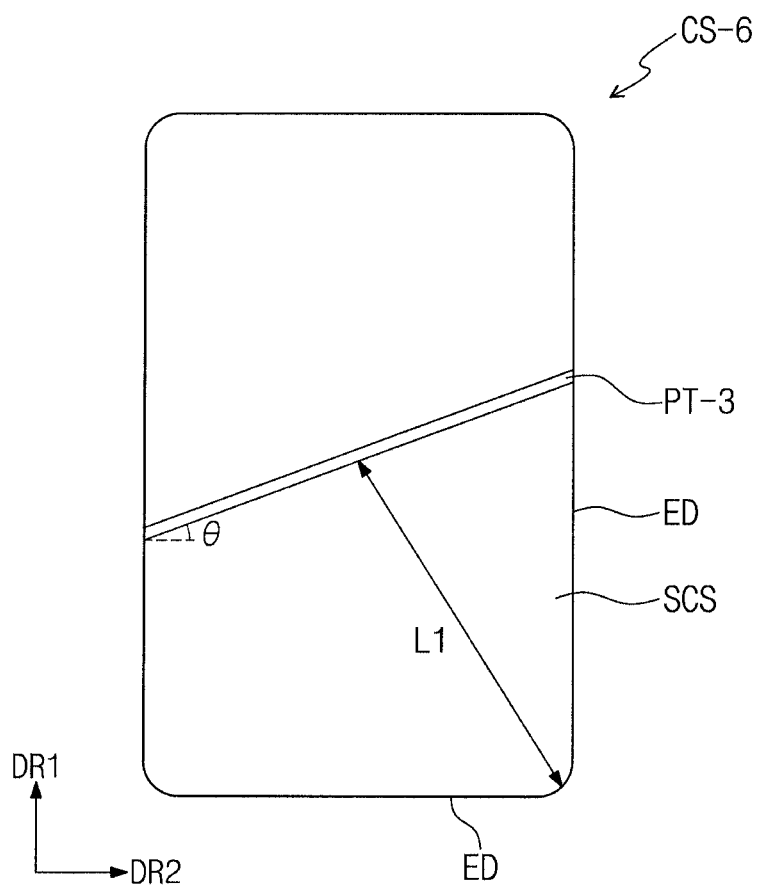

FIG. 10 is a plan view of a cushion layer CS-6 according to an embodiment of the inventive concept.

Referring to FIG. 10, a pattern PT-3 may be inclined at an acute angle θ to an edge ED (e.g., to a side edge of the cushion layer) of the cushion layer CS-6, and a portion of the pattern PT-3 (e.g., a center portion) may be spaced apart from one of vertices of the cushion layer CS-6 by the first length L1. In the cushion layer CS-6, the pattern PT-3 may be inclined at an acute angle θ to the edge ED (e.g., to a side edge of the cushion layer) of the cushion layer CS-6, and in this case, it may be possible to effectively attenuate an amplitude of vibration caused by the collision to a corner portion of the display device DD and to prevent or reduce damage to the display module DM caused by a resonance phenomenon. In the case where the pattern PT-3 is the opening-type pattern, the cushion layer CS-6 may be divided into two sub-cushion layers SCS by the pattern PT-3.

Similar to the pattern PT-O3 shown in FIG. 10, the patterns PT-O, PT-P, PT-O1, PT-P1, PT-O2, and PT-P2 shown in FIGS. 6A to 9B may also be inclined at an acute angle θ to the edge ED (e.g., to a side edge of the cushion layer) of the cushion layer CS or CS1 to CS5. Accordingly, it may be possible to effectively attenuate an amplitude of vibration caused by the collision to a corner portion and to prevent the display module DM from being damaged by the resonance phenomenon.

Figure 11:
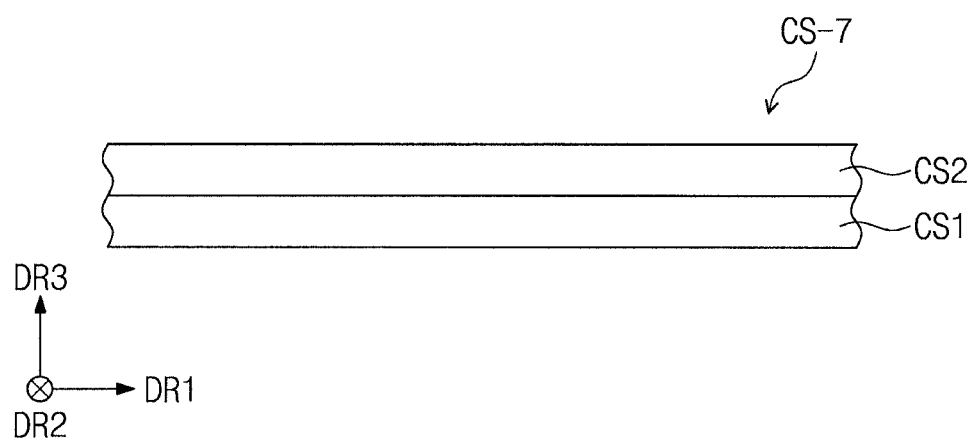
FIG. 11 is a sectional view illustrating a cushion layer according to an embodiment of the inventive concept.

FIG. 11 is a sectional view of a cushion layer CS-7 according to an embodiment of the inventive concept.

As shown in FIG. 11, the cushion layer CS-7 may include a first cushion layer CS1 and a second cushion layer CS2, which is in contact with the first cushion layer CS1. In an embodiment, an adhesive layer may be provided between the first cushion layer CS1 and the second cushion layer CS2.

In an embodiment, a pattern including vibration attenuating lines parallel to a side of the cushion layer CS-7 may be defined in one of the first cushion layer CS1 and the second cushion layer CS2, and a pattern including a vibration attenuating line inclined at an acute angle to a side of the cushion layer CS-7 may be defined in the other of the first cushion layer CS1 and the second cushion layer CS2. For example, the first cushion layer CS1 may be the cushion layer CS shown in FIG. 6A, and the second cushion layer CS2 may be the cushion layer CS-6 shown in FIG. 10.

When the display device DD includes the cushion layer CS-7, it may be possible to effectively attenuate an amplitude of vibration caused by collision to side and corner portions of the display device DD. Thus, it may be possible to prevent or protect the display module DM from being damaged by the collision to the side and corner portions of the display device DD.

FIG. 11 illustrates an example of the cushion layer CS including the first cushion layer CS1 and the second cushion layer CS2, but the inventive concept is not limited thereto. For example, the cushion layer CS may include three or more cushion layers.

Figure 12A:
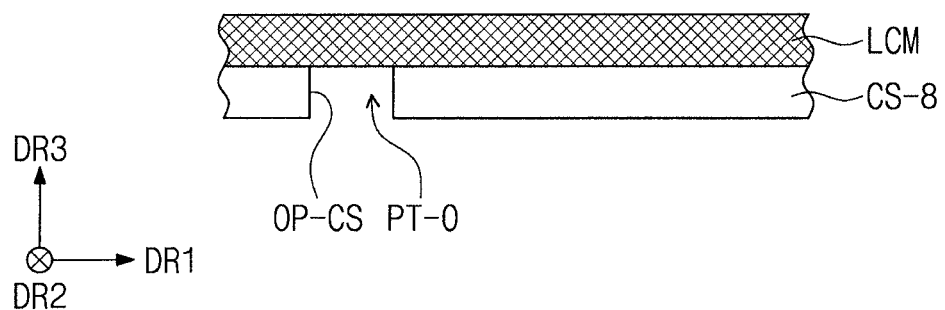
FIGS. 12A-12B are sectional views each illustrating a cushion layer and a blocking member according to an embodiment of the inventive concept.
Figure 12B:
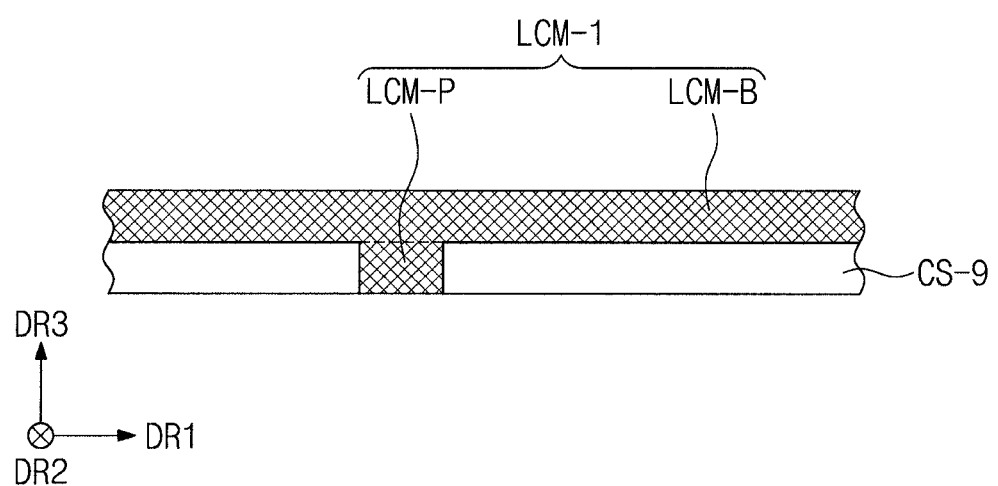

FIGS. 12A-12B are sectional views each illustrating a cushion layer CS-8 or CS-9 and a blocking member LCM or LCM-1 according to an embodiment of the inventive concept. The blocking member LCM or LCM-1 may be an adhesive member, which may be used to attach the display module DM to the cushion layer CS-8 or CS-9.

Referring to FIG. 12A, the blocking member LCM may be on the cushion layer CS-8. The blocking member LCM may have a black color.

Referring to FIG. 12B, the blocking member LCM-1 may include a blocking base portion LCM-B and a blocking protrusion portion LCM-P, which protrudes from the blocking base portion LCM-B. The blocking base portion LCM-B may be on the cushion layer CS-9, and the blocking protrusion portion LCM-P may be inserted into the opening OP-CS (e.g., opening illustrated in FIG. 12A) defined in the cushion layer CS-9. The blocking protrusion portion LCM-P may be configured to have the same function as the pattern defined in the cushion layer.

In the case where the pattern PT-O, which is defined in the cushion layer CS and includes a vibration attenuating line, is in the form of the opening OP-CS, the visibility may be deteriorated by the presence of the opening OP-CS (e.g., a visibility defect may occur). According to an embodiment of the inventive concept, the blocking member LCM or LCM-1 may be provided on the cushion layer CS-8 or CS-9 to protect or prevent the visibility from being deteriorated (e.g., due to a visibility defect).

Figure 13:
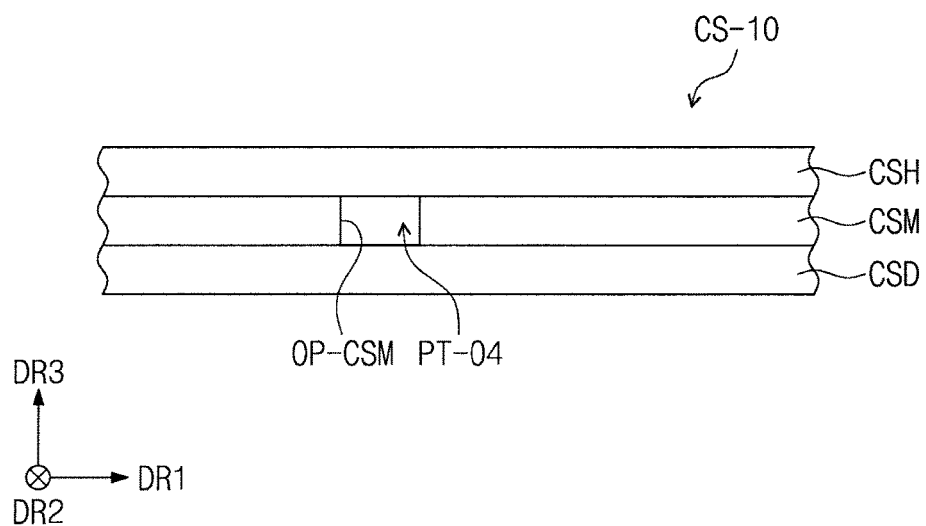
FIG. 13 is a sectional view illustrating a cushion layer according to an embodiment of the inventive concept.

FIG. 13 is a sectional view illustrating a cushion layer CS-10 according to an embodiment of the inventive concept.

Referring to FIG. 13, the cushion layer CS-10 may include a first layer CSD, a third layer CSH on the first layer CSD, and a second layer CSM between the first layer CSD and the third layer CSH. The first layer CSD and the third layer CSH may not include a pattern PT-O4, and the second layer CSM may include the pattern PT-O4 defined by an opening OP-CSM.

According to an embodiment of the inventive concept, because the pattern PT-O4 is formed in only the second layer CSM of the cushion layer CS-10, it may be possible to prevent or protect a visibility defect from occurring in a region corresponding to the pattern PT-O4.

Figure 14:
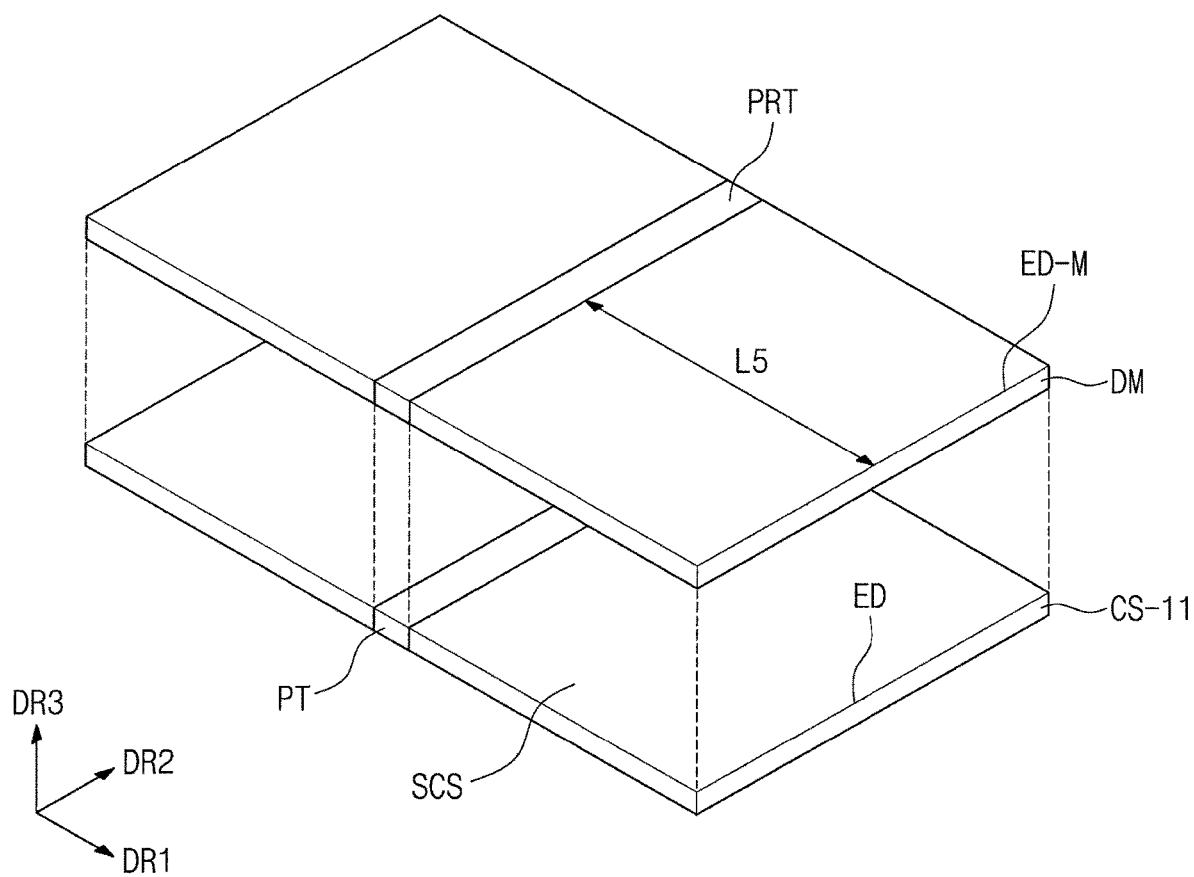
FIG. 14 is an exploded perspective view illustrating a cushion layer and a display module according to an embodiment of the inventive concept.

FIG. 14 is an exploded perspective view illustrating a cushion layer CS-11 and the display module DM according to an embodiment of the inventive concept.

Referring to FIG. 14, the display module DM may be on the cushion layer CS-11. A pattern PT including a vibration attenuating line extending in a specific direction (e.g., second direction DR2) may be defined in the cushion layer CS-11. The vibration attenuating line may overlap with a portion PRT of the display module DM, and the portion PRT of the display module DM may be spaced apart from an edge ED-M of the display module DM by a fifth length L5. The fifth length L5 may be one of the first length L1, the second length L2, and the third length L3 described above. The pattern PT may be the opening-type pattern (e.g., see FIG. 6B) or the protrusion-type pattern (e.g., see FIG. 7B). In the case where the pattern PT is the opening-type pattern, the cushion layer CS-11 may be divided into two sub-cushion layers SCS by the pattern PT.

FIG. 14 illustrates an example in which the cushion layer CS-11 is completely overlapped with the display module DM, but the inventive concept is not limited thereto. The cushion layer CS-11 may be overlapped with only a portion of the display module DM.

According to an embodiment of the inventive concept, the fifth length L5 may be measured from the edge ED-M of the display module DM, and thus, even though the cushion layer CS is not completely overlapped with the display module DM, it may be possible to reduce the chance of or prevent the display module DM from being damaged by a collision-induced vibration of the display device DD.

In an embodiment, the description associated with the length L5 of FIG. 14 may be applied to the first length L1, the second length L2, and the third length L3 described above, and therefore a detailed description thereof will not be provided.

According to an embodiment of the inventive concept, the display device DD may include the cushion layer CS, in which the pattern PT is provided. The pattern PT may be formed in a specific portion of the cushion layer CS, and this may make it possible to protect the display device DD from collision or impact, which may occur when the display device DD falls and hits another surface.

While example embodiments of the inventive concept have been particularly shown and described, it will be understood by one of ordinary skill in the art that variations in form and detail may be made therein without departing from the spirit and scope of the attached claims, and equivalents thereof.

What is claimed is:

1. A display device, comprising:
    a display module comprising a display panel and a window substrate on the display panel, the display panel comprising a circuit layer comprising a plurality of transistors, a light emitting device layer on the circuit layer and comprising a plurality of light-emitting devices, and an encapsulation layer encapsulating the light emitting device layer; and
    a cushion layer below the display module, a pattern comprising a vibration attenuating line extending in a second direction from an edge of the cushion layer to another edge of the cushion layer and an auxiliary vibration attenuating line crossing the vibration attenuating line and extending in a first direction from an edge of the cushion layer to another edge of the cushion layer, the vibration attenuating line and the auxiliary vibration attenuating line being defined by the cushion layer,
    wherein the vibration attenuating line is spaced apart from a reference edge of the cushion layer by a first length, and
    wherein the first length is a value obtained by dividing a sound speed in the display module by a natural frequency of the display module.

2. The display device of claim 1, further comprising a supporting member below the cushion layer.

3. The display device of claim 1, wherein the vibration attenuating line is an opening defined in the cushion layer.

4. The display device of claim 3, further comprising a blocking member, which is between the display module and the cushion layer and has a black color,
    wherein the blocking member comprises:
    a blocking base portion; and
    a blocking protrusion portion protruding from the blocking base portion into the opening.

5. The display device of claim 1, wherein the cushion layer comprises a base cushion portion and a protruding portion protruding from the base cushion portion,
    the vibration attenuating line is the protruding portion, and
    the base cushion portion and the protruding portion constitute a single integral object.

6. The display device of claim 1, wherein the pattern further comprises another auxiliary vibration attenuating line parallel to the vibration attenuating line and spaced apart from the reference edge of the cushion layer by a second length that is half the first length.

7. The display device of claim 1, wherein the reference edge is one of vertices of the cushion layer, and
    the vibration attenuating line is inclined at an acute angle to a side edge of the cushion layer.

8. The display device of claim 1, wherein the pattern further comprises:
    a first auxiliary vibration attenuating line parallel to the vibration attenuating line and spaced apart from the reference edge of the cushion layer by a second length that is half the first length;
    a second auxiliary vibration attenuating line between the vibration attenuating line and the first auxiliary vibration attenuating line; and
    a third auxiliary vibration attenuating line between the first auxiliary vibration attenuating line and the reference edge.

9. The display device of claim 8, wherein each of the second auxiliary vibration attenuating line and the third auxiliary vibration attenuating line is spaced apart from the first auxiliary vibration attenuating line by a third length that is half the second length.

10. The display device of claim 9, wherein the pattern comprises:
    a fourth auxiliary vibration attenuating line crossing at least one selected from the vibration attenuating line, the first auxiliary vibration attenuating line, the second auxiliary vibration attenuating line, and the third auxiliary vibration attenuating line; and
a fifth auxiliary vibration attenuating line parallel to the fourth auxiliary vibration attenuating line,
wherein the fourth auxiliary vibration attenuating line is the auxiliary vibration attenuating line.

11. The display device of claim 10, wherein at least one selected from the fourth auxiliary vibration attenuating line and the fifth auxiliary vibration attenuating line is spaced apart from another reference edge of the cushion layer by a fourth length that is equal to one selected from the first length, the second length, and the third length.

12. The display device of claim 1, wherein the cushion layer comprises a first layer, a second layer on the first layer, and a third layer on the second layer, and
the pattern is defined in the second layer.

13. A display device, comprising:
a display module comprising a display panel, an input-sensing circuit, and a window substrate;
a first cushion layer below the display module, a first pattern comprising a first vibration attenuating line defined by the first cushion layer; and
an adhesive member between the display module and the first cushion layer, the adhesive member having a black color,
wherein a portion of the display module overlapped with the first vibration attenuating line is spaced apart from an edge of the display module by a first length,
wherein the first length is equal to a value obtained by dividing a sound speed in the display module by a natural frequency of the display module,
wherein the first vibration attenuating line is an opening defined in the first cushion layer, and
wherein the adhesive member comprises:
a blocking base portion coupling the display module to the first cushion layer; and
a blocking protrusion portion protruding from the blocking base portion into the opening.

14. The display device of claim 13, wherein the first pattern further comprises an auxiliary vibration attenuating line parallel to the first vibration attenuating line, and
a portion of the display module overlapped with the auxiliary vibration attenuating line is spaced apart from the edge of the display module by a third length that is half a second length.

15. The display device of claim 13, wherein the first pattern further comprises:
a first auxiliary vibration attenuating line parallel to the first vibration attenuating line;
a second auxiliary vibration attenuating line between the first vibration attenuating line and the first auxiliary vibration attenuating line; and
a third auxiliary vibration attenuating line between the first auxiliary vibration attenuating line and the edge.

16. The display device of claim 15, wherein a portion of the display module overlapped with the first auxiliary vibration attenuating line is spaced apart from the edge of the display module by a third length that is half a second length, and
each of portions of the display module, which are respectively overlapped with the second auxiliary vibration attenuating line and the third auxiliary vibration attenuating line, is spaced apart from the first auxiliary vibration attenuating line by a fourth length that is half the third length.

17. A display device, comprising:
a display module comprising a display panel, an input-sensing circuit, and a window substrate;
a first cushion layer below the display module, a first pattern comprising a first vibration attenuating line defined by the first cushion layer;
an adhesive member between the display module and the first cushion layer, the adhesive member having a black color; and
a second cushion layer, which is in contact with the first cushion layer, and in which a second pattern is defined, and
when viewed in a plan view, the second pattern comprises a second vibration attenuating line, which is inclined at an acute angle to the first vibration attenuating line,
wherein a portion of the display module overlapped with the first vibration attenuating line is spaced apart from an edge of the display module by a first length, and
wherein the first length is equal to a value obtained by dividing a sound speed in the display module by a natural frequency of the display module.

* * * * *